(12) United States Patent
Yu et al.

(10) Patent No.: US 8,603,643 B2
(45) Date of Patent: Dec. 10, 2013

(54) ELECTRONIC COMPONENT HAVING TIN RICH DEPOSIT LAYER AND THE PROCESS FOR DEPOSITING THE SAME

(75) Inventors: Cheng-Fu Yu, Kaohsiung (TW);
Chia-Chun Chen, Kaohsiung (TW);
Pascal Oberndorff, Eindhoven (NL);
Ker-Chang Hsieh, Kaohsiung (TW)

(73) Assignee: NXP, B.V., Eindhoven (NL)

(*) Notice: Subject to any disclaimer, the term of this patent is extended or adjusted under 35 U.S.C. 154(b) by 2096 days.

(21) Appl. No.: 11/632,029

(22) PCT Filed: Jul. 4, 2005

(86) PCT No.: PCT/IB2005/052208
§ 371 (c)(1),
(2), (4) Date: Aug. 15, 2007

(87) PCT Pub. No.: WO2006/006114
PCT Pub. Date: Jan. 19, 2006

(65) Prior Publication Data
US 2008/0038574 A1    Feb. 14, 2008

(30) Foreign Application Priority Data
Jul. 7, 2004  (CN) .......................... 2004 1 0063715

(51) Int. Cl.
*B32B 15/01*    (2006.01)
(52) U.S. Cl.
USPC .......................................... 428/646; 428/647
(58) Field of Classification Search
None
See application file for complete search history.

(56) References Cited

U.S. PATENT DOCUMENTS

| | | | |
|---|---|---|---|
| 5,361,515 A | * | 11/1994 | Peremyschev .................. 34/393 |
| 2003/0201188 A1 | * | 10/2003 | Schetty et al. ................ 205/300 |
| 2003/0226758 A1 | | 12/2003 | Egli |

FOREIGN PATENT DOCUMENTS

EP    1 342 816 A2    9/2003

OTHER PUBLICATIONS

Lee J C et al: "Characterization Study of Lead-Free Sn-Cu Plated Packages"; 2002 Proceedings 52$^{nd}$ Electronic Components and Technology Conf. ECTC 2002; San Diego CA May 28-31, 2002; pp. 1238-1245.
Lee, Jeffrey Chang-Bing et al. "Characterization Study of Lead-Free Sn-Cu Plated Packages," R&D Division, Advanced Semiconductor Engineering, Inc.

* cited by examiner

*Primary Examiner* — David Sample
*Assistant Examiner* — Adam Krupicka

(57) ABSTRACT

The invention relates to an electronic component with Sn rich deposit layer on the part for electric connection, wherein the Sn rich deposit layer is a fine grained Sn rich deposit layer composed of grains with smaller size in the direction perpendicular to the deposit surface than in the direction parallel to the deposit surface. It also relates to a process for plating an electronic component, so as to form a Sn rich deposit layer on the part for electric connection, comprising the steps of: adjusting the composition of tin plating solution in which starter additive and brighter additive are included; moving the electronic component through the tin plating solution, so as to form a fine grained Sn rich deposit layer on the part for electric connection. As compared with the prior art, the invention can validly inhibit the whisker growth with low cost and reliable property.

8 Claims, 10 Drawing Sheets

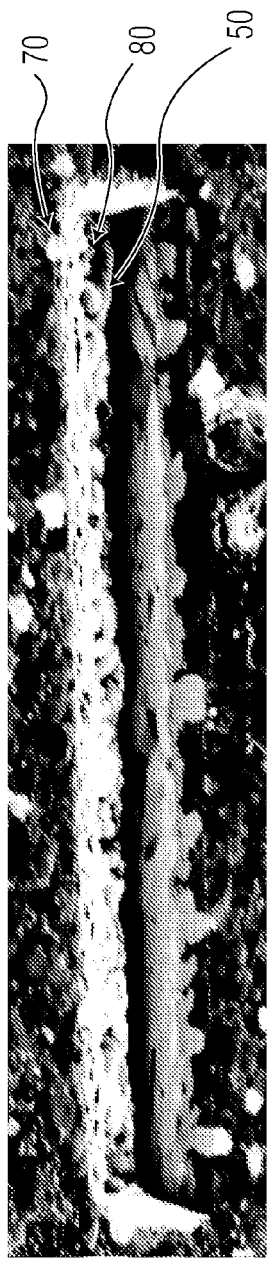
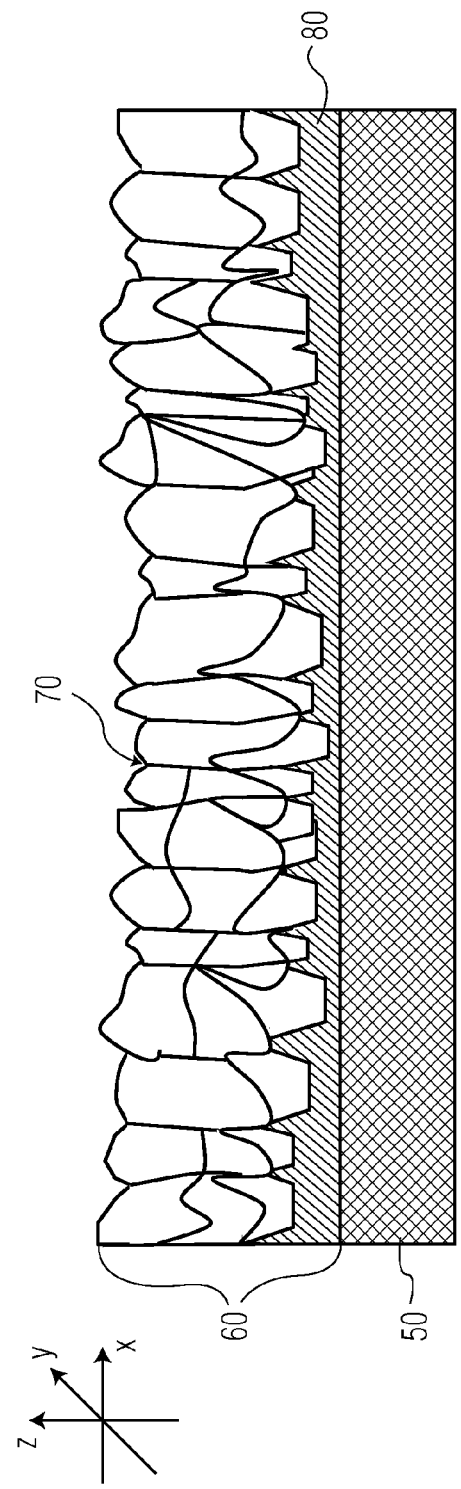
FIG. 5A
FIG. 5B

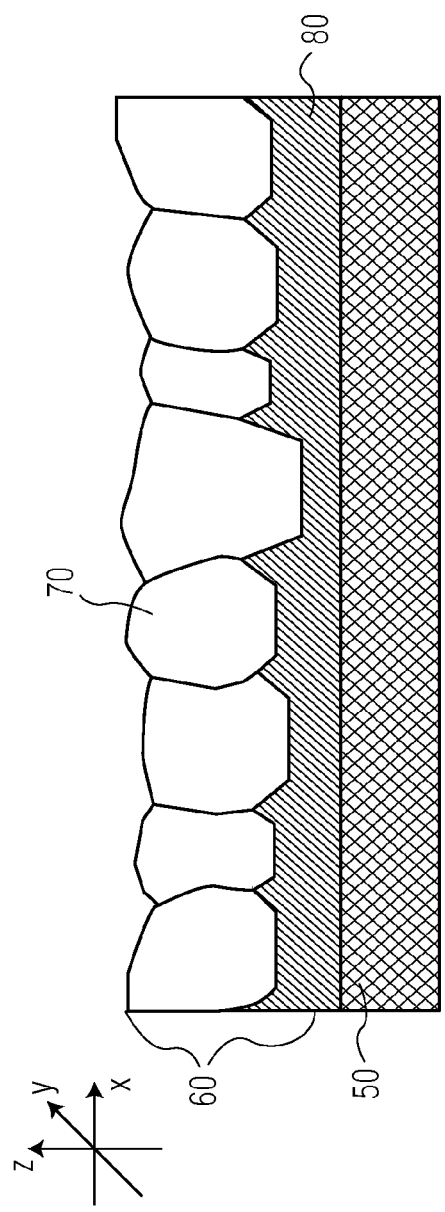
FIG. 6A
FIG. 6B

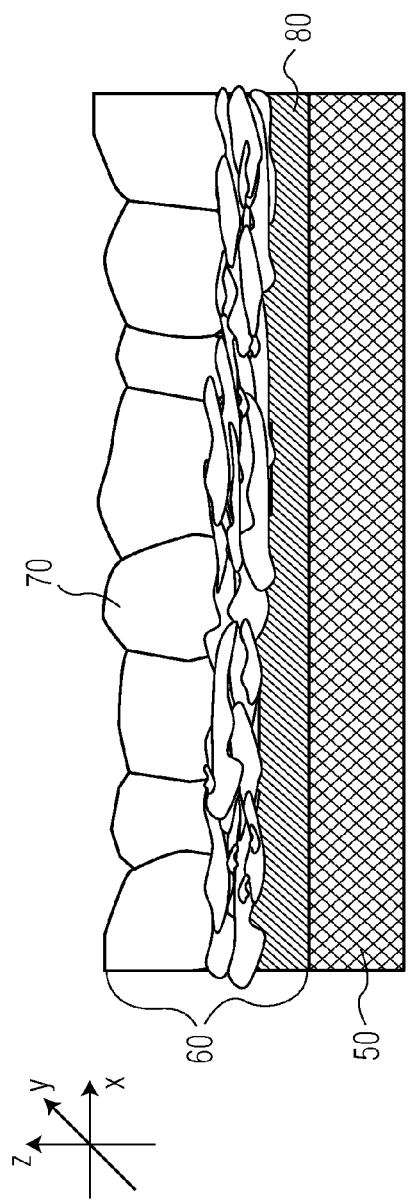
FIG. 7A
FIG. 7B

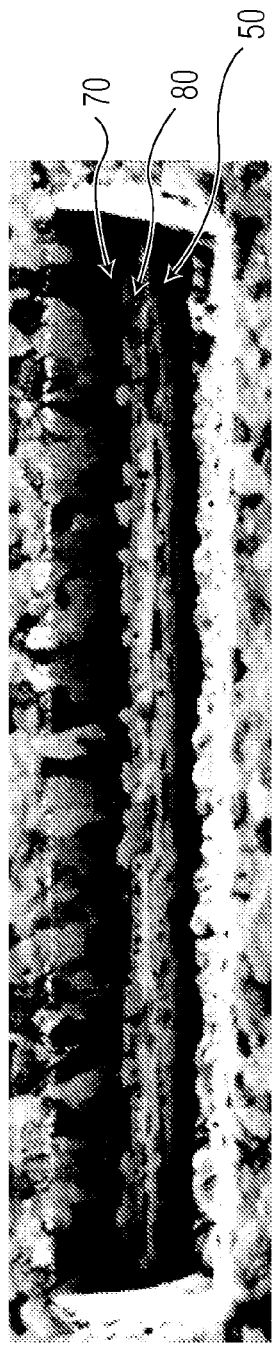
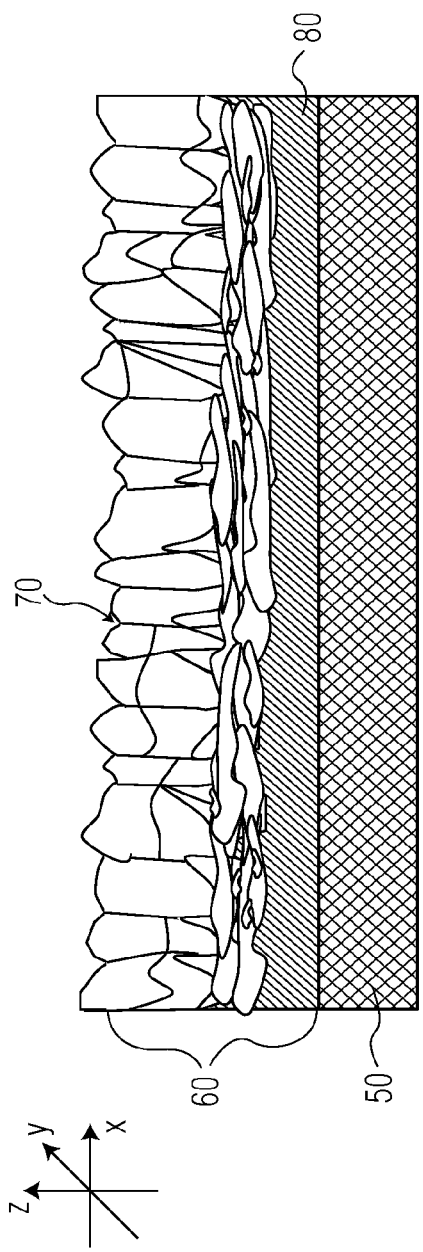
FIG. 8A
FIG. 8B

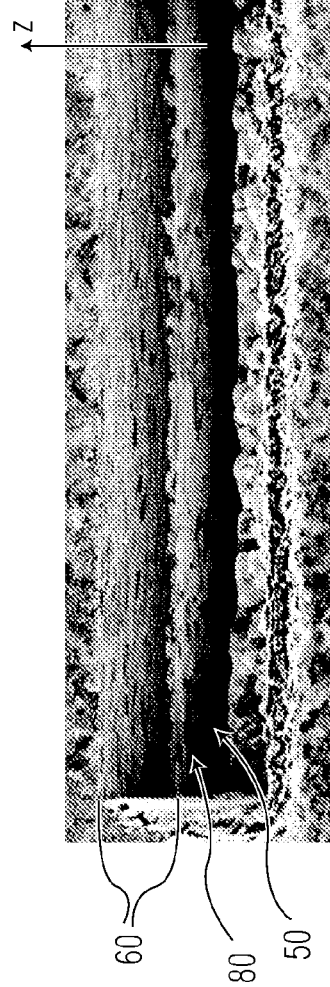
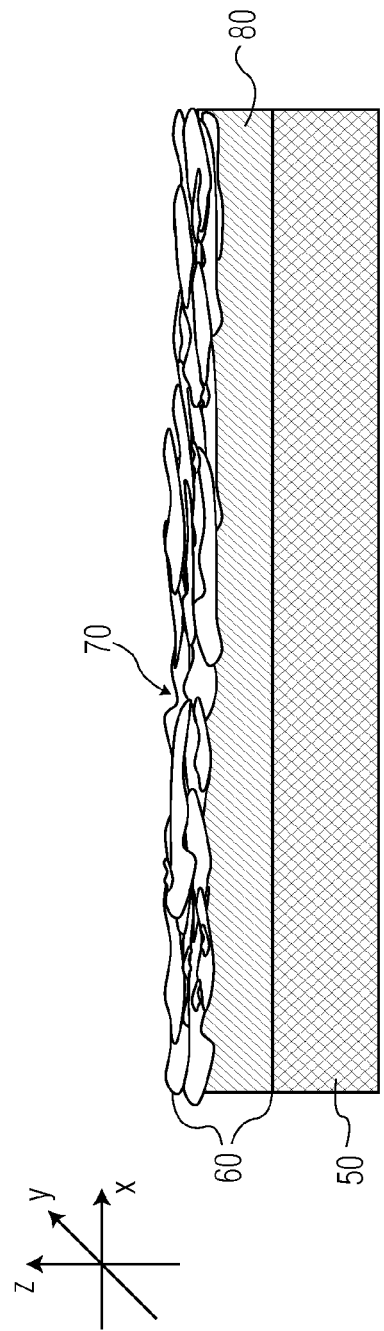
FIG. 10A
FIG. 10B

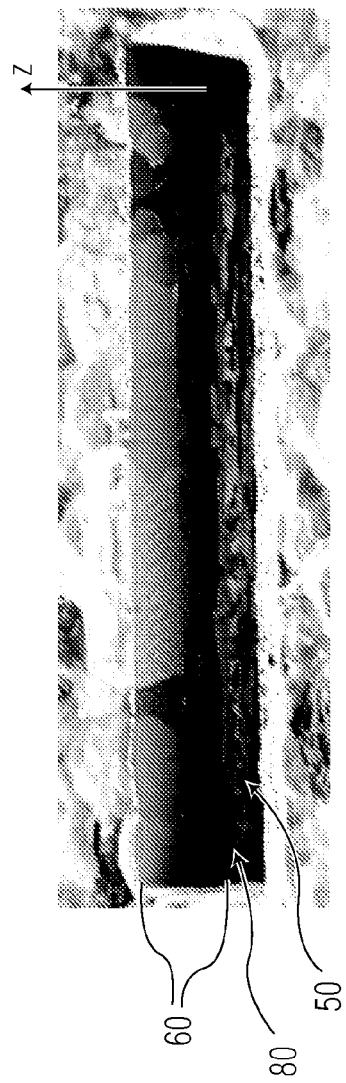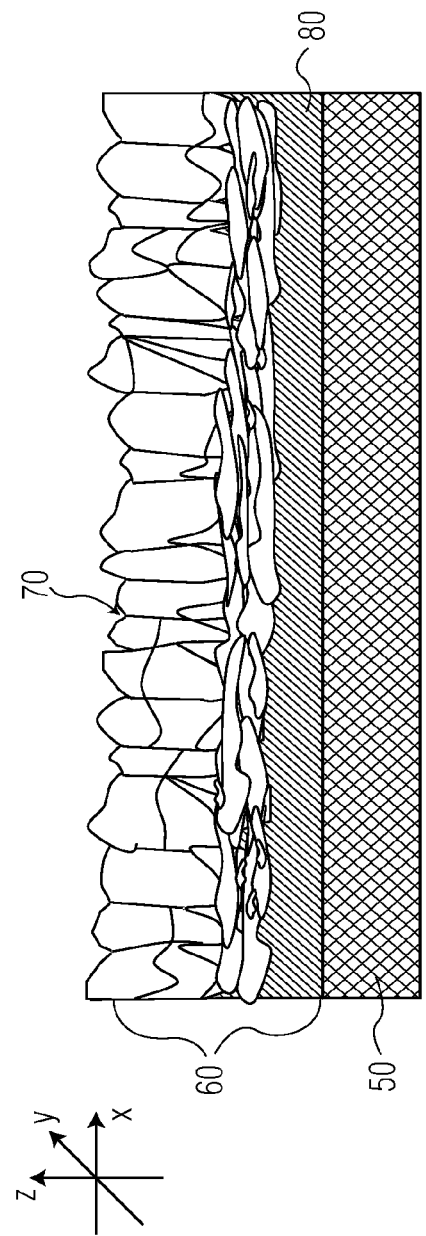
FIG. 11A
FIG. 11B

ELECTRONIC COMPONENT HAVING TIN RICH DEPOSIT LAYER AND THE PROCESS FOR DEPOSITING THE SAME

BACKGROUND OF THE INVENTION

The present invention relates to an electronic component, in particular to an electronic component with Sn rich deposit layer on the part for electric connection, and the process for depositing the same.

Tin is known as a metal which has excellent corrosion resistance, and it can form an excellent bond with solder, so a surface with Sn deposit layer can be used to form good soldered connections, and the Sn deposit layer can provide excellent corrosion resistance for the surface of metal or metal alloy. As a result, Sn or Sn rich deposit layer is widely used in the manufacture of electrical equipments or electronic components (e.g. semiconductor elements). Generally, Sn or Sn rich material is deposited on the parts for electric connection (e.g., leads) of electronic components and substrate (e.g., electronic components mother board), so as to preserve good solderability and interconnection.

However, as well known, Sn is susceptible for whisker growth. This whisker growth is mainly caused by the growth of intermetallic compound (IMC), such as $Cu_6Sn_5$, in the grain boundaries of the Sn.

FIG. 1A is a photograph of the microstructure of a cut taken from a Sn deposit layer in the prior art. As shown in FIG. 1A, a Sn deposit layer 20 is deposited on a substrate 10. In the Sn deposit layer 20, an intermetallic compound 30 is formed in the boundaries between a Sn grain 40 and the substrate 10. FIG. 1B is a schematic view of the photograph as shown in FIG. 1A. The growth of the intermetallic compound 30 will bring a change of the volume and thus introduce stress in the Sn deposit layer 20. Besides, the irregular growth of the intermetallic compound 30 can introduce local stress in the Sn deposit layer 20. This kind of compressive stress in turn results in whisker growth. The presence and growth of whisker will adversely affect the electrics property of the electrical component, since if the whisker grows to sufficient length, it will bring a low impedance among the terminals of the electrical component, or even cause short in the electrical circuit and malfunction of the electrical component or electrical equipment. Especially, as the ever increasing density of the electrical components in the integrate circuit package, the distance among different terminals and the intervals of wirings in the substrate are getting more and more narrower, and the adverse influence of the whisker on the electrics property of the electrical component is getting more obvious.

To inhibit the presence or growth of whisker, another measure used in the prior art is to add a barrier layer, such as a nickel layer, between the substrate and the Sn deposit layer. However, this measure will complicate the manufacturing process of the electronic component and increase its cost. In another kind of technology used to prevent or inhibit whisker growth, the electronic component is subjected to a heat treatment. By this technology, the intermetallic compound in the boundaries between the Sn deposit layer and the substrate will grow as a sort of bulk diffusion at a higher temperature, so that the whisker growth is greatly inhibited. However, the process of this technology is also complicated, and the heat treatment sometimes may bring side effect on the electrical component. Furthermore, some electrical components are not suitable to carry out such a heat treatment.

Accordingly, there is a demand to provide a process for Sn depositing, which can prevent or at least retard whisker growth in a Sn deposit layer.

OBJECT AND SUMMARY OF THE INVENTION

It is one object of the invention to provide an electronic component with Sn rich deposit layer on the part for electric connection, which has stable electrics property and low manufacturing cost.

Another object of the invention is to provide a process for plating the electronic component as mentioned above, so as to form a Sn rich deposit layer on the part for electric connection, and which has the merit of simple manufacturing process, high reliability and low cost.

To achieve the object of the invention, an electronic component with Sn rich deposit layer on the part for electric connection is provided, wherein the Sn rich deposit layer is a fine grained Sn rich deposit layer composed of grains with smaller size in the direction perpendicular to the deposit surface than in the direction parallel to the deposit surface.

Thus it can be seen, in the solution of the invention, a fine grained Sn rich deposit layer is directly deposited on the part for electric connection of an electronic component (so that there is no need to add a barrier layer or carry out a subsequent heat treatment), and the grains in the fine grained Sn rich deposit layer are controlled to be distributed in a special way as mentioned above. By this way, the grains in the deposit layer are controlled to arrange in a desirable way for whisker prevention, and thus the morphology of the intermetallic compound is optimized, so that the object to effectively prevent or retard whisker growth is completely fulfilled by a simple way.

Preferably, the size of grains in the direction perpendicular to the deposit surface is not more than 2 μm.

Preferably, the grains substantially take the same orientation in the direction parallel to the deposit surface.

Preferably, the grains are irregular in shape.

Preferably, the thickness of the Sn rich deposit layer is at least 2 μm.

Preferably, an additional deposit layer or additional deposit layers can be formed on the Sn rich deposit layer.

Preferably, the additional deposit layer(s) and the Sn rich deposit layer have different grain structure.

Preferably, the part for electric connection is made by copper or copper alloy. For instance, the part can be a copper or copper alloy coating.

According to another aspect of the invention, it provides a method to manufacture the Sn rich deposit layer of the electrical component as mentioned above. Specially, the invention provides a process for plating an electronic component, so as to form a Sn rich deposit layer on the part for electric connection, the process comprises the steps of: adjusting the composition of tin plating solution in which starter additive and brighter additive are included; moving the electronic component through the tin plating solution, so as to form the Sn rich deposit layer on the part for electric connection, wherein the Sn rich deposit layer is a fine grained Sn rich deposit layer composed of grains with smaller size in the direction perpendicular to the deposit surface than in the direction parallel to the deposit surface.

Thus it can be seen, by adding a certain amount of organic additive (at least includes some starter additive and brighter additive) and rationally controlling the different parameters in the plating process, the new process of the invention can effectively form the Sn rich deposit layer by a simple, reliable and cost saving way.

Preferably, the starter additive includes aqueous solution of nonionic wetting agents, and the brighter additive is selected from ethoxylated naphthol sulphonic acid, α-naphthol or α-naphthol sulphonic acid.

Preferably, the concentration of the starter additive is substantially in the range of 40-100 g/l, and the amount of the brighter additive is substantially in the range of 3-9 ml/l.

Preferably, the solvent for the brighter additive includes isopropyl glycol.

Preferably, the tin plating solution is methyl sulfonic acid base tin plating solution.

Preferably, the process further comprises a step of controlling the plating condition, and the plating condition comprises a current density substantially in the range of 25-30 ASD and a bath temperature substantially in the range of 18-45° C. Alternatively, the plating condition comprises a current density substantially in the range of 5-25 ASD and a bath temperature substantially in the range of 18-35° C. Besides, it further comprises a step of controlling the plating time so that the thickness of the fine grained Sn rich deposit layer is at least 2 μm.

Preferably, the process further comprises a step of forming a normal Sn rich deposit layer on the fine grained Sn rich deposit layer.

BRIEF DESCRIPTION OF THE DRAWINGS

The above and other objects, features and advantages of the present invention will become more apparent from the following detailed description made with reference to the accompanying drawings and various embodiments. In the drawings:

FIGS. 4A to 9B show the photography and schematic view of the structure of grains after the HTH (high temperature and humidity) whisker test according to several embodiments and comparative examples of the present invention;

FIGS. 10A and 10B show the photography and schematic view of "semi-bulk diffusion" IMC in one preferred embodiment of the present invention; and FIGS. 11A and 11B the photography and schematic view of "semi-bulk diffusion" IMC in another preferred embodiment of the present invention.

In the drawings, the same reference number represents the same, similar or corresponding feature or function.

DETAILED DESCRIPTION OF THE INVENTION

For conciseness, the process and product of the invention will be described in details hereinafter by an example of plated Matte Tin deposit layer. However, this does not mean to any limit on the application of the invention. For one skilled in the art, it is easy to be understood that the invention could not only be applied in the Matte Tin deposit layer, but also could be applied in other Sn rich deposit layers, such as SnCu, SnBi, SnAg deposit layer.

The preferred and comparative examples of the present invention are prepared by an auto strip plating line or a conventional Hull cell. The auto strip plating line is available in the market and a schematic view of its construction is shown in FIG. 2.

Figure 1A:
FIGS. 1A and 1B show the photograph and schematic view of the microstructure of a cut taken from a Sn deposit layer in the prior art.
Figure 1B:
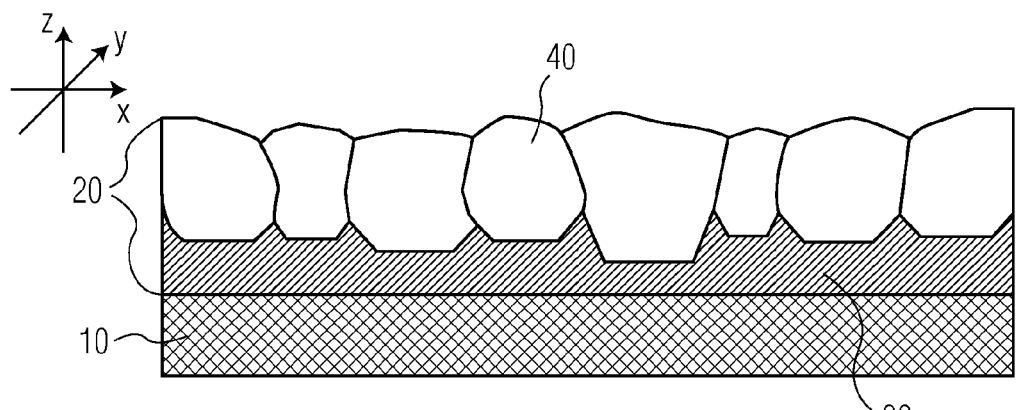
Figure 2:
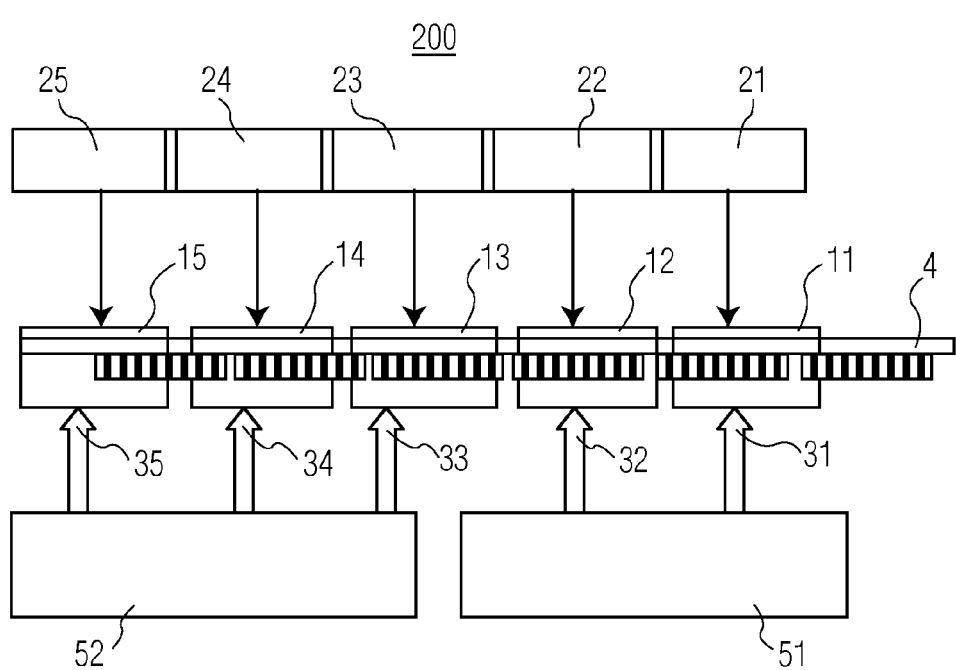
FIG. 2 shows a schematic view of an auto strip plating line used in the plating process according to one embodiment of the present invention.

Specially, FIG. 2 shows a schematic view of an auto strip plating line 200 used in the plating process according to one embodiment of the present invention.

The auto strip plating line 200 comprises tanks 11-15, rectifiers 21-25 for transforming an alternative current into a direct current and supplying the same to each tank, baths 51, 52 and a steel belt 4 for conveying a substrate. The auto strip plating line 200 further comprises some nozzles 31-35 for ejecting plating solution from the bottom.

According to the invention, in the tanks filled with plating solution, the metal Tin serves as an anode, and the product to be plated serves as a cathode. According to a typical example, the product to be plated is SDIP (Shrink dual in line package) 64/24, and the lead frame (L/F) of the SDIP 64/24 is alloy 194 (one kind of copper L/F, comprising 2.4% Fe, 0.03% P, 0.1% Zn, and Cu remain). The two electrodes are electrically connected to the corresponding anode and cathode of a direct current power supply respectively.

The plating solution can be a methyl sulfonic acid based tin plating solution available in the market, it comprises of Tin methyl sulfonic acid in the amount of 40 g/l and methyl sulfonic acid in the amount of 150 g/l, and some starter additive with a concentration of 40-100 g/l (preferably, 40 g/l) and some brighter additive with a dose of 3-9 ml/l (preferably, 4 ml/l) are added. The starter additive can use aqueous solution of nonionic wetting agents, the brighter additive can be selected from ethoxylated naphthol sulphonic acid, α-naphthol or α-naphthol sulphonic acid, and the solvent can be isopropyl glycol based solvent or other suitable solvent known in the art. Of course, some other additive or composition can be added into the plating solution based on the specific or practical need, which will not be described in detail here since they are common knowledge in the art.

The controllable factors or parameters for the plating condition are listed as follows:

Belt speed: 4.0-8.0 m/min;
Nozzle flow: 0.5-7 m$^3$/hour/tank;
Plating time: 10-100 s Of course, these factors or parameters can be adjusted depend on the different plating product (such as different plating area).

TABLE 1

Plating condition optimization

| | | Bath temperature | |
|---|---|---|---|
| Plating condition | | 35-45° C. | 18-35° C. |
| adding With starter additive and brighter additive | Current density: 25-30 ASD | B1 | B2 |
| | Current density: 5-25 ASD | A | B2 |
| Without starter additive and brighter additive | Current density: 25 ASD | C | C |
| | Current density: 15 ASD | C | C |

Figure 3:
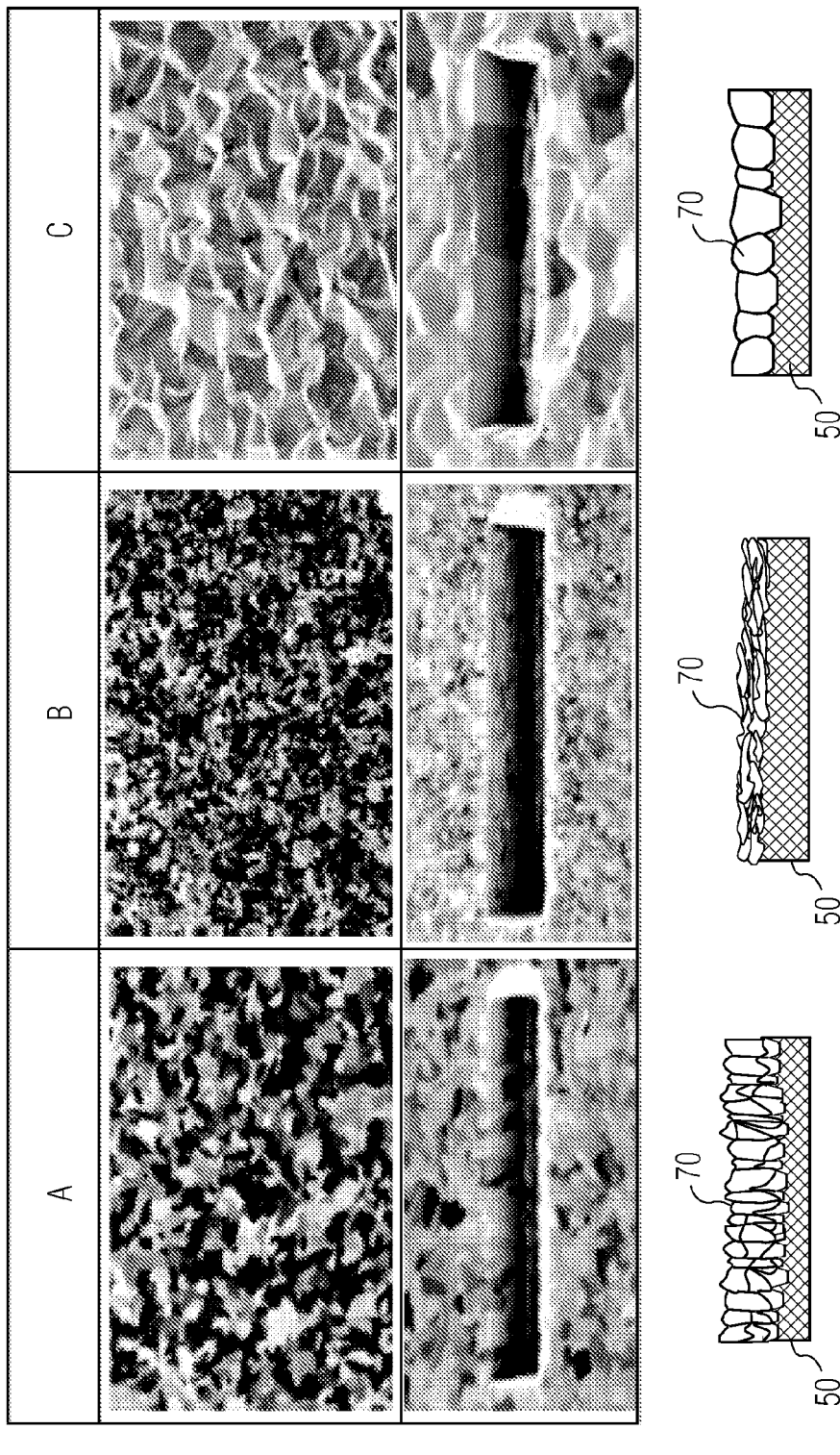
FIG. 3 shows the surface topography and the morphology of a cut in regular modified matte Tin (Regular MMT), irregular modified matte Tin (Irregular MMT) and regular matte Tin (Regular MT)
Figure 4A:
Figure 4B:
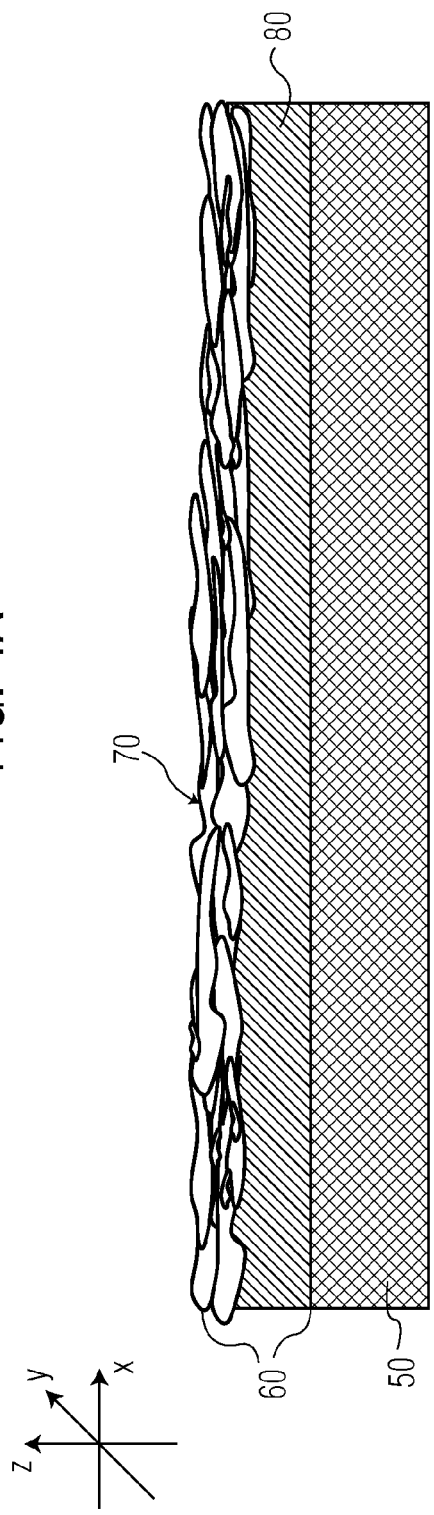
Figure 9A:
Figure 9B:
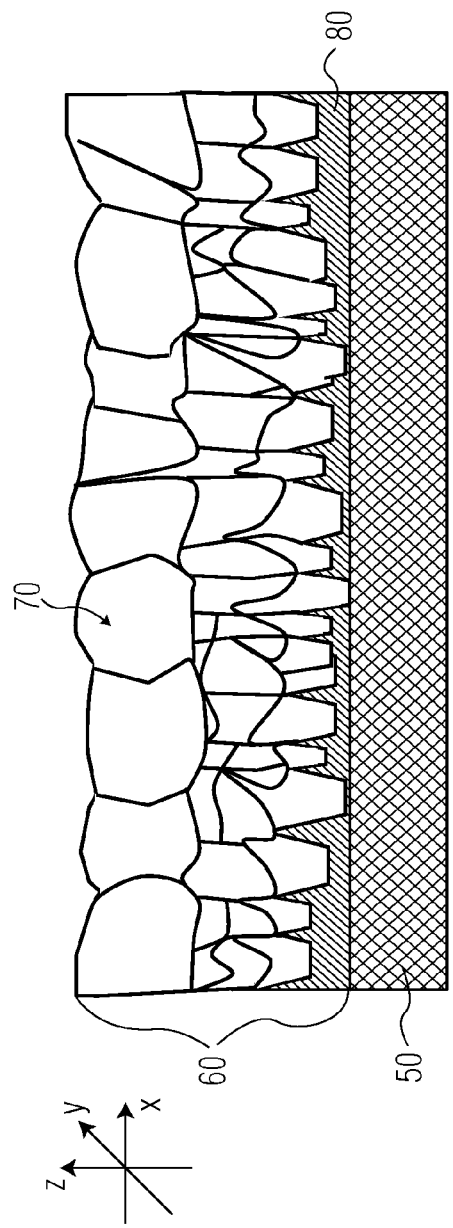

Note:
ASD: Amp per square decimeter
A: Regular Modified Matte Tin
B1: Irregular Modified Matte Tin with a high bath temperature
B2: Irregular Modified Matte Tin with a low bath temperature
C: Regular Matte Tin It can be seen from table 1, by adjusting the plating condition, Sn deposit layers with three different types of grain structure as shown in FIG. 3 can be obtained. Specially, FIG. 3 shows the surface topography and the morphology of a cut (formed by Focused Ion Beam technology) with three different types of grain structure, i.e., regular modified matte Tin (Regular MMT) A, irregular modified matte Tin (Irregular MMT) B and regular matte Tin (Regular MT) C. As shown in FIG. 3, regular modified matte Tin A and regular matte Tin C generally have the similar grain structure, i.e., columnar grain structure, which has a much larger size in the direction perpendicular to the deposit surface than in other directions. In contrast, irregular modified matte Tin B has another kind of grain structure (so called as non-columnar grain structure), which is completely different from the columnar grain structure as mentioned above. It can be known from the description hereinafter in combination with what shown in FIG. 3, both the regular modified matte Tin A and the regular matte Tin C are predominated by the grains perpendicular to a substrate, and whisker growth can be observed regardless the size of grains. On the other hand, the irregular modified matte Tin B is predominated by the grains parallel to a substrate, in this case, since the copper atoms mainly diffuse from the substrate to the deposit layer along the grain boundaries and most of the grain boundaries in the irregular modified matte Tin B are parallel to the substrate, the intermetallic compound will grow as a sort of semi-bulk diffusion, so that the wedge typed growth of intermetallic compound is inhibited.

It can be known from table 1 and FIG. 3, by properly adjusting the plating condition, the Sn deposit layer with different types of grain structure can be obtained. It is apparent from FIG. 4A to FIG. 11B, in the grain structure of irregular modified matte Tin B of the invention, the size of the grains in the direction perpendicular to the deposit surface (i.e., direction Z) is much smaller than in the directions parallel to the deposit surface (i.e., direction X or Y), which will be described in details hereinafter.

It has been proved that under the plating condition as mentioned above, only the regular matte Tin C can be obtained if there is no starter additive and brighter additive in the plating solution. The regular modified matte Tin A can be obtained in the case that starter additive and brighter additive are added in the plating solution, the current density is lower and the bath temperature is higher. The irregular modified matte Tin B1 (when the bath temperature is higher) and B2 (when the bath temperature is lower) can be obtained in the case that starter additive and brighter additive are added in the plating solution and the current density is higher.

By controlling the plating condition so as to obtain form three different types of grain structure and limiting the total thickness of the deposit layer(s) in a range of 2-10 µm, the examples C1-C34 with Sn deposit layer(s) on SDIP 64/24 (see table 2) and the examples R1-R11 with Sn deposit layer(s) on SDIP 32 (see table 3) are prepared.

FIGS. 4A to 9A show the photography of the grain structure in examples C28, C33, C21, C15, C1, and C32 respectively, FIGS. 4B to 9B show the schematic views corresponding to FIGS. 4A to 9A. In these Figures, the reference number 50 represents a substrate (e.g., Cu L/F), the reference number 60 represents a deposit layer, the reference number 70 represents a Sn grain, and the reference number 80 represents an intermetallic compound.

The samples obtained from these examples are placed in an environment of 55° C., 85% RH (High Temperature and Humidity, HTH test) for 2000 hours (see table 2) and placed at the room temperature for 15 months (see table 3), so that HTH whisker test is carried out, so as to compare the behavior of whisker growth and analyze the effect of grain structure and plating condition on the whisker growth.

TABLE 2

Result of HTH test of whisker
(Sample specification: C1-C22, C29-C34 and M1-M6 64 leads × 12 product = 768 leads,
C23-C28: 24 leads × 12 product = 288 leads, plating area: 13.39 mm² per lead)

| Example | Bottom layer Thickness | Bottom layer Structure | Top layer (second layer) Thickness | Top layer (second layer) Structure | Total thickness | whisker (Maximum) |
|---|---|---|---|---|---|---|
| C1  | 2 µm  | B1 I | 4 µm | A I | 6 µm  | None |
| C2  | 2 µm  | B2   | 4 µm | A   | 6 µm  | None |
| C3  | 2 µm  | B1   | 8 µm | A   | 10 µm | None |
| C4  | 2 µm  | B2   | 8 µm | A   | 10 µm | None |
| C5  | 4 µm  | B1   | 2 µm | A   | 6 µm  | None |
| C6  | 4 µm  | B2   | 2 µm | A   | 6 µm  | None |
| C7  | 4 µm  | B1   | 6 µm | A   | 10 µm | None |
| C8  | 4 µm  | B2   | 6 µm | A   | 10 µm | None |
| C9  | 2 µm  | B1   | 6 µm | C I | 8 µm  | None |
| C10 | 2 µm  | B2   | 6 µm | C   | 8 µm  | None |
| C11 | 4 µm  | B1   | 3 µm | C   | 7 µm  | None |
| C12 | 4 µm  | B2   | 3 µm | C   | 7 µm  | None |
| C13 | 2 µm  | B1   | 3 µm | C   | 5 µm  | None |
| C14 | 4 µm  | B1   |      |     | 4 µm  | None |
| C15 | 2 µm  | B2   | 3 µm | C   | 5 µm  | None |
| C16 | 4 µm  | B2   |      |     | 4 µm  | None |
| C17 | 2 µm  | B1   |      |     | 2 µm  | None |
| C18 | 2 µm  | B2   |      |     | 2 µm  | None |
| C19 | 4 µm  | B1   | 6 µm | C   | 10 µm | None |
| C20 | 4 µm  | B2   | 6 µm | C   | 10 µm | None |
| C21 | 6 µm  | C    |      |     | 6 µm  | 30 µm II |
| C22 | 10 µm | C    |      |     | 10 µm | 23 µm |
| C23 | 2 µm  | B2   | 4 µm | A   | 6 µm  | None |
| C24 | 4 µm  | B2   | 2 µm | A   | 6 µm  | None |
| C25 | 2 µm  | B2   | 8 µm | A   | 10 µm | None |
| C26 | 2 µm  | B2   | 8 µm | A   | 10 µm | None |
| C27 | 2 µm  | B2   |      |     | 2 µm  | None |
| C28 | 4 µm  | B2   |      |     | 4 µm  | None |
| C29 | 2 µm  | A    | 3 µm | C   | 5 µm  | 38 µm |

TABLE 2-continued

Result of HTH test of whisker
(Sample specification: C1-C22, C29-C34 and M1-M6 64 leads × 12 product = 768 leads,
C23-C28: 24 leads × 12 product = 288 leads, plating area: 13.39 mm² per lead)

| Example | Bottom layer Thickness | Bottom layer Structure | Top layer (second layer) Thickness | Top layer (second layer) Structure | Total thickness | whisker (Maximum) |
|---|---|---|---|---|---|---|
| C30 | 4 μm | A | 3 μm | C | 7 μm | Hillock 26 μm |
| C31 | 2 μm | A | 6 μm | C | 8 μm | Hillock 24 μm |
| C32 | 4 μm | A | 6 μm | C | 10 μm | Hillock 21 μm |
| C33 | 2 μm | A | | | 2 μm | Hillock 55 μm |
| C34 | 4 μm | A | | | 4 μm | 41 μm |
| M1 | 4 μm | C' I | | | 4 μm | 43.5 μm |
| M2 | 7.5 μm | C' | | | 7.5 μm | 39 μm |
| M3 | 10 μm | C' | | | 10 μm | 44 μm |
| M4 | 4.4 μm | C' | 2.85 μm | A | 7.25 μm | 18 μm |
| M5 | 3.5 μm | B2 | 4.4 μm | C | 7.9 μm | None |
| M6 | 3.5 μm | B2 | | | 3.5 μm | None |

Note:
I) Structure types A and B are produced by auto strip plating line, structure type C is produced by hull cell, structure type C' is produced by auto strip plating line
II) Maximum length of whisker

TABLE 3

Result of whisker test in room temperature (Sample specification: 32 leads
× 12 product = 384 leads plating area: 13.39 mm² per lead)

| Example | Bottom layer Thickness | Bottom layer Structure | Top layer (Second layer) Thickness | Top layer (Second layer) Structure | Total thickness | Whisker (Maximum) |
|---|---|---|---|---|---|---|
| R1 | 10 μm | A I | | | 10 μm | 590 μm |
| R2 | 5.9 μm | A | | | 5.9 μm | 752 μm |
| R3 | 2.1 μm | A | | | 2.1 μm | 1050 μm |
| R4 | 10 μm | C' I | | | 10 μm | 221 μm |
| R5 | 6 μm | C' | | | 6 μm | 382 μm |
| R6 | 10.7 μm | B2 I | | | 10.7 μm | None |
| R7 | 7.5 μm | B1 | 2.3 μm | A | 9.8 μm | None |
| R8 | 6.0 μm | B1 | | | 6.0 μm | None |
| R9 | 3.0 μm | B1 | 3.0 μm | C' | 6.0 μm | None |
| R10 | 3.5 μm | B1 | | | 3.5 μm | None |
| R11 | 3.0 μm | B2 | | | 3.0 μm | None |

Note:
I) Structure types A and B are produced by auto strip plating line, structure type C' is produced by auto strip plating line By analyzing these examples with reference to the accompanying drawings, the following conclusion can be made.

Presence of Whisker

As shown in the examples C1-C20 of table 2, if the grain structure of the bottom layer exhibits an irregular structure type B (irregular modified matte Tin B), none whisker grows in the HTH test till 2000 hours. In contrast, as shown in the examples C21-C22, C29-C34, M1-M4 of table 2 and the comparative examples R1-R5 of table 3, if the grain structure of the bottom layer exhibits a regular structure type, i.e., regular matte Tin C or regular modified matte Tin A, whisker appears in all the cases.

Accordingly, as shown in FIGS. 4A-9B, none whisker presents in finished product even after the HTH whisker test since the same bottom structure B is selected. In contrast, in both the examples C21 and C33 in which a bottom structure C or A is sleeted, whisker is observed.

It can be further known from the examples C28, C15 and C1 as shown in FIGS. 4A, 4B, 7A, 7B, 8A and 8B, in the solution of the invention, a fine grained deposit layer is directly deposited on a substrate, and the grains in the fine grained deposit layer are formed in a specific structure type, that is, these grains have a smaller (preferably, much smaller) size in the direction perpendicular to the deposit surface than in the direction parallel to the deposit surface. In this condition, the intermetallic compound between Sn and the substrate will grow along the grain boundaries, which are closer together than in the normal deposit and be evenly distributed over the deposit layer (e.g., Sn layer), causing a more lateral growth of the intermetallic compound, resulting in a better distribution of stress and thus no whisker growth.

It can be clearly seen this kind of growth of the intermetallic compound from two preferred embodiments of the invention, which is best shown in FIGS. 10A, 10B, 11A and 11B. Specially, as compared with the "bulk diffusion" appearing at higher temperature, the intermetallic compound in the invention grows as a sort of "semi-bulk diffusion". In contrast, as shown in FIGS. 1A, 1B, 5A, 5B, 6A, 6B, 9A and 9B, the normal Sn deposit layer in the art has a columnar grain structure, which allows a wedge typed growth of the intermetallic compound (e.g., $Cu_6Sn_5$) in the vertical direction along the grain boundaries, and thus results in whisker growth.

Furthermore, it has been found that in the invention, the size of grains in the direction perpendicular to the deposit surface is preferably not more than 2 μm. More preferably, the size of grains in the direction perpendicular to the deposit surface (i.e., direction Z) is 0.05-2 μm, and the size of grains in the direction parallel to the deposit surface (i.e., direction X or Y) is 0.2-10 μm. For example, when the size in the direction X or Y is 2 μm or more, the size in the direction Z is preferably set to about 1 μm; when the size in the direction X or Y is 0.2 μm or more, the size in the direction Z is preferably set to about 0.05 μm. Besides, it is preferred that the sizes in the direction X and Y are different, and an example is: X=0.5 μm, Y=0.2 μm. Further, it is preferred that all the grains in the deposit layer tend to be arranged in the same orientation parallel to the deposit surface, so that the whisker growth will be more effectively inhibited.

Thickness of the Deposit Layer

The total thickness of the deposit layer is well known in the art. In the examples of C1-C20, the total thickness is set as 2-10 μm.

It can be seen from the examples C1-C20 and C23-C28 as shown in table 2, when the same bottom structure type B (i.e., irregular modified matte Tin B) is exhibited in the bottom layer, none whisker grows in the HTH whisker test till 2000 hours regardless the thickness and structure of the top layer, even only 2 μm thickness of the bottom layer. There is clear conclusion that if the bottom layer dominates IMC self-bulk diffusion not to induce whisker growth, the whisker will be inhibited regardless the thickness and structure of the top layer.

Thickness of Irregular (Non-Columnar) Grain Structure on the Bottom Layer

To compare the thickness of irregular grain structure on the bottom layer-2 μm and 4 μm, the thinner has the same effect with the thicker. In this evaluation, the thickness, 2 μm, is enough to retard whisker growth.

Plating Condition

It can be seen from table 1 that the irregular (non-columnar) grain structure can be obtained both in a higher bath temperature and in a lower bath temperature. That is, the bath temperature is not the crucial factor of the invention.

Referring to FIGS. 11A and 11B, if necessary (e.g., in order to obtain an excellent surface roughness), one or more additional Sn rich deposit layers can be added on the fine grained Sn rich deposit layer of the present invention. The additional Sn rich deposit layer can be formed by any suitable technology well known in the art.

In summary, in the solution of the invention, a fine grained Sn rich deposit layer with a specific irregular grain structure is directly deposited on a substrate, so that the intermetallic compound is induced to grow as a sort of semi-bulk diffusion and thus whisker growth is effectively inhibited. Furthermore, in the case that the deposit layer in constituted by two layers, that is, a top layer and a bottom layer, if the bottom layer dominates IMC self-bulk diffusion not to induce whisker growth, the whisker will be inhibited regardless the thickness and structure of the top layer. Besides, it can be concluded that the self-bulk diffusion of IMC has more influence on whisker growth than plating thickness. It has been proved that the intermetallic compound in the fine grained Sn deposit layer of the invention will grow as a sort of semi-bulk diffusion in any case, regardless the storage temperature.

Obviously, the invention is not limited to be applied to SDIP 64/32/24. Instead, it can also be applied to lead of integrate circuit package and discrete element (e.g., transistor/diode and passive component of chip resistor/capacitor), electrical connector, substrate (printed circuit board or tape) or any other electrical component known in the art. Preferably, the invention is applied to copper base material that needs Sn rich deposit lay and sensitive for whisker issue.

Although particular embodiments of the invention have been described in detail herein with reference to the accompanying drawings, it is to be understood that these embodiments are only given for the purpose of illustration, and the invention is not limited to those particular embodiments. As a matter of fact, various changes and modifications may be effected therein by one skilled in the art without departing from the scope or spirit of the invention.

What is claimed is:

1. An electronic component with Sn rich deposit layer on a part for electric connection, wherein the Sn rich deposit layer is a fine grained Sn rich deposit layer composed of grains with smaller size in the direction perpendicular to the deposit surface than in the direction parallel to the deposit surface.

2. The electronic component according to claim 1 wherein the size of grains in the direction perpendicular to the deposit surface is not more than 2 μm.

3. The electronic component according to claim 1 wherein the grains substantially take the same orientation in the direction parallel to the deposit surface.

4. The electronic component according to claim 1 wherein the grains are irregular in shape.

5. The electronic component according to claim 1 wherein the thickness of the Sn rich deposit layer is at least 2 μm.

6. The electronic component according to claim 5 wherein the one or more additional deposit layer(s) and the Sn rich deposit layer have different grain structure.

7. The electronic component according to claim 1 wherein one or more additional deposit layer(s) is formed on the Sn rich deposit layer.

8. The electronic component according to claim 1, wherein the part for electric connection is made by copper or copper alloy.

\* \* \* \* \*